Figure 1:
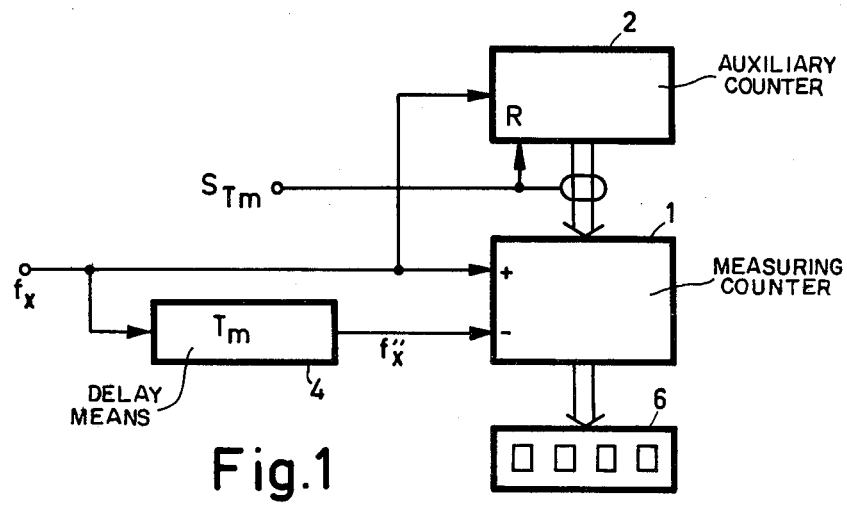

United States Patent [19]

Schröder

[11] 4,073,432
[45] Feb. 14, 1978

[54] CIRCUIT ARRANGEMENT FOR DETERMINING THE AVERAGE VALUE OF A FREQUENCY

[75] Inventor: Gerd Schröder, Hamburg, Germany

[73] Assignee: U.S. Philips Corporation, New York, N.Y.

[21] Appl. No.: 741,213

[22] Filed: Nov. 12, 1976

[30] Foreign Application Priority Data

Nov. 20, 1975 Germany .............................. 2552079

[51] Int. Cl.$^2$ ........................ G01R 23/02; G06M 3/14
[52] U.S. Cl. ........................... 235/92 FQ; 235/92 EV; 235/92 CC; 235/92 R; 324/78 D
[58] Field of Search ........ 235/92 FQ, 92 TF, 92 EV, 235/92 CC, 92 PE, 150.3; 324/78 D

[56] References Cited

U.S. PATENT DOCUMENTS

| | | | |
|---|---|---|---|
| 3,683,345 | 8/1972 | Faulkes et al. ................. | 235/92 EV |
| 3,735,347 | 5/1973 | Whitney et al. ................ | 235/92 EV |
| 3,868,498 | 2/1975 | Guggenbuhl .................... | 235/92 EV |
| 3,956,616 | 5/1976 | Knollenberg ..................... | 235/92 CC |

Primary Examiner—Joseph M. Thesz
Attorney, Agent, or Firm—Frank R. Trifari; Bernard Franzblau

[57] ABSTRACT

A known arrangement for continuously averaging a frequency comprises a counter whose count-up input receives a measuring signal and whose count-down input receives the delayed measuring signal, by which the averaging period is determined. However, spurious signals produce a cumulative indication error. In order to avoid this, an additional counter is included which each time counts the measuring signal from zero onwards and after the predetermined time interval transfers its count to the measuring counter and starts again at zero. As a result, the measuring counter is always corrected after the predetermined time interval so that errors cannot accumulate. The predetermined time interval can be obtained by means of a further counter. For delaying the measuring signal, a RAM can be used which is controlled by the further counter.

9 Claims, 2 Drawing Figures

CIRCUIT ARRANGEMENT FOR DETERMINING THE AVERAGE VALUE OF A FREQUENCY

The invention relates to a circuit arrangement for determining the average value of the frequency of a measuring signal during a directly preceding time interval of predetermined constant duration, with the aid of a measuring counter whose count-up input receives the substantially undelayed measuring signal and whose count-down input receives the measuring signal which has been delayed by the duration of the time interval in a delay means and whose count is a measure of the average value of the frequency of the measuring signal in the relevant preceding time interval.

Such a circuit arrangement is known from U.S. Pat. No. 3,646,330. By the use of an add/subtract scaler as a measuring counter and by delaying the measuring signal by a predetermined time, the number of pulses during the relevant preceding time interval is counted by the scaler. The pulse frequency can then be derived from this number and the known duration of the time interval. However, this known circuit arrangement has the drawback that a spurious pulse received at one of the count inputs permanently yields an incorrect measuring result because no correction can be applied for such a spurious pulse. Several spurious pulses may then accumulate at one count input so that the measuring result is affected very unfavorably and without this error being directly noticeable. Therefore, this circuit arrangement cannot be used in installations where a high reliability and accuracy are required, as for example in assized weighing systems which employ pressure transducers whose output signal is a frequency-analog signal.

It is an object of the invention to design a circuit arrangement as mentioned in the preamble in which the effect of spurious signals at a count input of the measuring counter is minimized and in which spurious signals cannot accumulate. In accordance with the invention this is achieved in that the circuit arrangement exhibits the characteristic features specified in the principal claim. By the use of an auxiliary counter, which always unambiguously starts at zero and which measures the frequency for a time interval only and then transfers the resulting value to the measuring counter, a possible error in the measuring counter is always compensated for after a maximum of one time interval.

Characteristic features of suitable embodiments of the invention are described in the subclaims.

Figure 2:
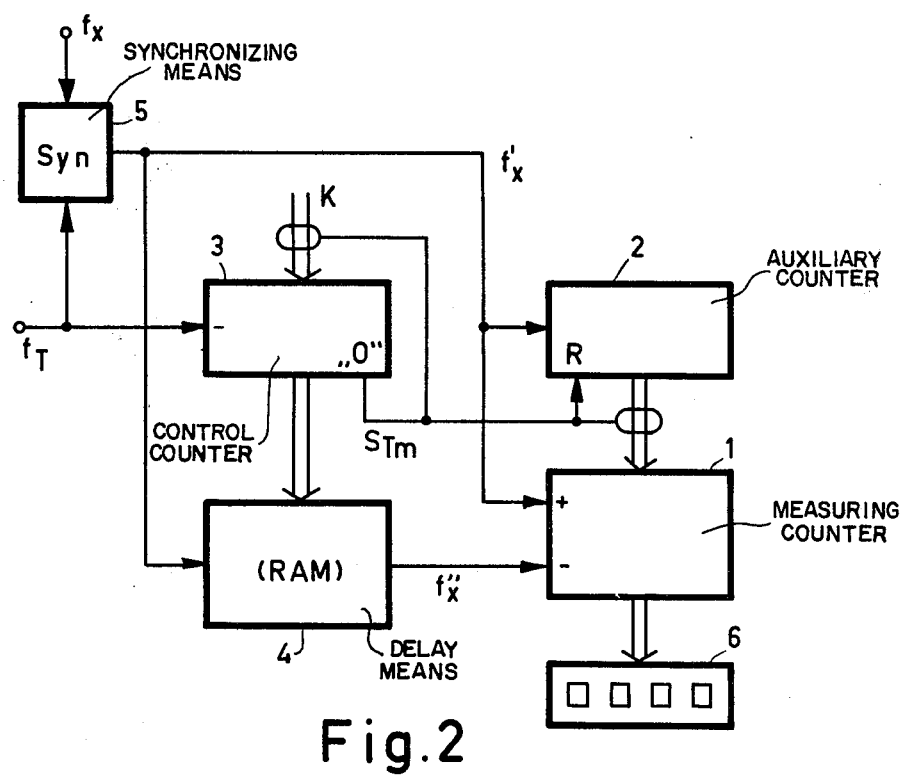

The invention will be described in more detail with reference to the accompanying drawing, in which:

FIG. 1 shows a general block diagram of a circuit arrangement in accordance with the invention, and FIG. 2 shows an embodiment of the circuit arrangement of FIG. 1 comprising a control counter and a memory.

The measuring counter 1 of FIG. 1 receives at its count-up input the measuring signal $f_x$ whose frequency is to be determined. The count-up input is designated "+." This measuring signal is also applied to a delay means 4 which delays said measuring signal by a time interval of predetermined duration $Tm$. This delayed measuring signal $f'_x$ is applied to the count-down input of the measuring counter 1, which input is designated "−." Furthermore, the measuring signal $f_x$ is applied to an auxiliary counter 2 whose outputs are connected in parallel with the corresponding set inputs of the measuring counter 1. Setting of the measuring counter 1 is provided by the auxiliary counter 2 and resetting of the auxiliary counter 2 occurs via the input R and is controlled by means of a time control signal $S_{Tm}$.

In the description of the operation it is first of all assumed that the two counters 1 and 2 are in the zero state. When pulses of the measuring signal $f_x$ are received, the two counters 1 and 2 are first advanced in parallel because it is assumed that the delay means 4 is initially empty, so that no pulses of the delayed measuring signal $f'_x$ appear. At the end of the first time interval a time control signal $S_{Tm}$ appears which transfers the contents of the auxiliary counter 2 to the measuring counter 1 and subsequently resets the auxiliary counter 2 to zero via the input R. This may, for example, be effected by means of the trailing edge of the time control signal $S_{Tm}$ via a differentiation network, or two successive short time control signals are generated in fact, of which the first signal controls the transmission path between the two counters and the second signal resets the auxiliary counter 2.

The counters 1 and 2 with their set and reset inputs can be realized by means of the TTL-elements of the 74160 through 74163 series of Texas Instruments, Inc. Similar circuits are described in U.S. Pat. No. 3,633,202.

Henceforth, the delay means 4 also supplies the pulses of the delayed measuring signal $f''_x$. When the frequency of the measuring signal $f_x$ is constant, the two count inputs of the measuring counter 1 now receive an equal number of pulses so that the count is not changed. At the same time, at the beginning of the next time-control signal $S_{Tm}$ the auxiliary counter 2 has reached the same count as the first time owing to the constant frequency of the measuring signal. Therefore, when this count is transferred the count of the measuring counter 1 is not changed. However, should the count of the measuring counter 1 have changed owing to spurious signals, this error will be corrected by the transfer of the count of the auxiliary counter.

When the frequency of the measuring counter signal $f_x$ increases or decreases, the count-up input of the measuring counter 1 receives a correspondingly greater or smaller number of pulses than the count-down input, so that the count of the counter then increases or decreases. Simultaneously, the auxiliary counter 2 also receives a correspondingly greater or smaller number of counting pulses within a specific time interval, so that at the end of each time interval the counts of the two counters will correspond in the absence of errors, or the measuring counter 1 is corrected if errors do occur. The count of the measuring counter 1 is consequently a measure of the average frequency of the measuring signal $f_x$ during the directly preceding time interval of predetermined duration $T_m$ and this count can, for example, be displayed with the aid of an indicator 6 or can be processed in any other desired manner.

In the detailed block diagram of FIG. 2, blocks which correspond to the blocks of the circuit arrangement of FIG. 1 are denoted by the same reference symbols. The synchronizing means 5 may be represented by the D flip-flops 20 and 21 of the cited U.S. Pat. No. 3,646,330. This synchronizing means 5 derives a synchronized measuring signal $f'_x$ from the measuring signal $f_x$ with the aid of a clock signal $f_T$ of constant frequency, the pulses of said synchronized measuring signal appearing exclusively in the pattern of the clock signal. This synchronized measuring signal is applied to the measuring counter 1 and to the auxiliary counter 2 as well as to the delay means 4.

The time control signal $S_{Tm}$ is generated by a control counter 3 which receives the clock signal $f_T$ at its count-down input, which is also designated "−." When this counter reaches the zero state, the time control signal $S_{Tm}$ is generated at the output designated "0." This signal, as described with reference to FIG. 1, transfers the count of the auxiliary counter 2 to the measuring counter 1 and furthermore resets the auxiliary counter to zero. Moreover, this signal sets the control counter 3 to an initial count K, which is externally selected, for example via switches. Depending on the circuit design of the counters it may be necessary to store the time control signal briefly in order to ensure that the signal does not disappear prematurely when the control counter is set to the initial count, i.e., before the set and reset operations have been performed. Such an intermediate storage facility has been omitted in FIG. 2 for the sake of clarity. The spacing between the time control signal $S_{Tm}$, i.e., the predetermined duration $T_m$ of the time interval, is then defined by the initial value K and the frequency of the clock signal $f_T$, the last-mentioned frequency being constant so that the time interval can be adjusted directly by the initial value K. It is alternatively possible to use a conventional count-up counter instead of a count-down counter for the control counter 3, but in that case the duration of the time interval is then determined by the complement of the initial value K related to the maximum capacity of the control counter 3. Alternatively, the control counter 3 may be set directly to the complement.

The delay means 4 may take the form of an electric or electroacoustic delay line, but may alternatively be a shift register, as is designated by the reference numeral 30 in the U.S. Pat. No. 3,646,330.

In the present embodiment the delay means 4 is constituted by a random access memory (RAM) whose address inputs are driven by the control counter 3. For this purpose a RAM type of the Signetics 2100 series may be used. In the present form of the control counter 3, the memory 4 sequentially scans the addresses from K to zero. At an addressed memory location the information stored therein is first read out and applied to the count-down input of the measuring counter 1 as a delayed measuring signal $f'_x$, and immediately after this information is entered which information represents the instantaneous synchronized measuring signal $f_x$, which in the simplest case is the measuring signal itself.

This newly entered information is read out when the control counter 3 has performed a complete cycle and this is the case just after the predetermined or preset duration $Tm$ of the time interval, as explained hereinbefore. As a result of this, the synchronized measuring signal $f_x$ appears at the output of the memory 4 exactly after the time interval. This necessarily ensures that there is a specific relation between the delay time of the delay means 4 for the measuring signal and the predetermined length of the time interval.

This may be illustrated as follows. The signal $f_x$ to be measured, for example the frequency of a frequency analog convertor to which a load transducer is connected, ranges from 500 to 1500 Hz. The counters are BCD-counters of the previously stated type, with four decimal outputs, only one bit being used for the digit 1 of the highest decimal. The most suitable measuring time is 1 second. For the frequency $f_T$ a value of 2000 Hz suffices, in which case the means 4 must be capable of storing 200 bits.

What is claimed is:

1. A circuit arrangement for determining the average value of the frequency of a measuring signal during a directly preceding time interval of predetermined constant duration comprising, a delay means providing a delay equal to said time interval, a measuring counter having a count-up input which receives a substantially undelayed measuring signal and having a count-down input which receives the measuring signal after being delayed by the duration of the time interval in said delay means, the count in said measuring counter being a measure of the average of the frequency of the measuring signal in the relevant preceding time interval, an auxiliary counter having a count input which receives the substantially undelayed measuring signal, and means for applying a time control signal, which recurs at an interval equal to said predetermined time interval, to the auxiliary counter so that the count of the auxiliary counter is transferred to the measuring counter and immediately thereafter sets the auxiliary counter to zero.

2. A circuit arrangement as claimed in claim 1 further comprising, a clock signal source of fixed frequency, a synchronizing means coupled to receive the measuring signal and the clock signal and including means which synchronizes the measuring signal with the clock signal, and means coupling the count inputs of the measuring counter and the auxiliary counter to the output of the synchronizing means so as to receive the synchronized measuring signal.

3. A circuit arrangement as claimed in claim 2 further comprising a control counter for generating said time control signal, a clock signal source of fixed frequency coupled to a count input of the control counter whereby the clock signal advances the control counter to a predetermined final count whereupon the control counter supplies said time control signal at an output thereof, the duration of the time interval being determined by the clock signal frequency and the difference between the final count and an initial count in the control counter.

4. A circuit arrangement as claimed in claim 3 wherein the delay means comprises an addressable memory device, means coupling the control counter to the memory device so that the control counter controls the address inputs of the memory device and reads out the information in the addressed memory location and applies same to the count-down input of the measuring counter as a delayed measuring signal and subsequently stores in the same memory location the information which represents the instantaneous measuring signal.

5. A circuit arrangement as claimed in claim 1 further comprising a control counter for generating the time control signal, a clock signal source of fixed frequency coupled to a count input of the control counter which receives the clock signal and upon reaching a predetermined final count supplies the time control signal which sets said control counter to a predetermined initial count such that the duration of the time interval is determined by the frequency of the clock signal and the difference between the final and the initial count in the control counter.

6. A circuit arrangement as claimed in claim 5, characterized in that the delay means comprises an addressable memory, and that the control counter controls the address inputs of the memory and reads out the information in the addressed memory location and applies it to the count-down input of the measuring counter as a delayed measuring signal, and subsequently stores the information, which represents the instantaneous measuring signal, at the same memory location.

7. Apparatus for measuring the average value of the frequency of a measuring signal comprising, a terminal for receiving the measuring signal, delay means coupled to said terminal and providing a constant delay time interval, a measuring counter having a count-up input coupled directly to said terminal to receive an undelayed measuring signal and a count-down input coupled to the output of the delay means to receive a delayed measuring signal delayed for said time interval, the count in said counter indicating the average value of the measuring signal frequency for the preceding time interval, an auxiliary counter coupled to the measuring counter and having a count input coupled directly to said terminal to receive an undelayed measuring signal a source of time control signals recurring at said constant time interval, and means for coupling said time control signals to the auxiliary counter whereby the count in the auxiliary counter is transferred to the measuring counter and the auxiliary counter is thereafter reset to its initial position.

8. Measuring apparatus as claimed in claim 7 wherein said source of time control signals comprises a presettable control counter having a count input and an output coupled to control the initial count in the control counter, a clock signal source coupled to the count input of the control counter to supply a clock signal thereto so that, upon reaching a predetermined final count, the control counter produces a time control signal which sets the control counter to said initial count, the duration of the time interval being determined by the clock frequency and the difference between the final and initial counts in the control counter.

9. Measuring apparatus as claimed in claim 7 further comprising a display device coupled to the measuring counter for displaying the count therein.

* * * * *